United States Patent
Brodsky et al.

(10) Patent No.: US 9,323,631 B2
(45) Date of Patent: *Apr. 26, 2016

(54) VALIDATING CONNECTION, STRUCTURAL CHARACTERISTICS AND POSITIONING OF CABLE CONNECTORS

(71) Applicant: INTERNATIONAL BUSINESS MACHINES CORPORATION, Armonk, NY (US)

(72) Inventors: William L. Brodsky, Binghamton, NY (US); William P. Kostenko, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/555,824

(22) Filed: Nov. 28, 2014

(65) Prior Publication Data
US 2015/0178173 A1    Jun. 25, 2015

Related U.S. Application Data

(63) Continuation of application No. 14/135,641, filed on Dec. 20, 2013, now Pat. No. 9,183,104.

(51) Int. Cl.
| | |
|---|---|
| *G06F 3/00* | (2006.01) |
| *G06F 15/173* | (2006.01) |
| *G06F 11/22* | (2006.01) |
| *G06F 11/30* | (2006.01) |
| *H05K 7/14* | (2006.01) |
| *G06F 11/07* | (2006.01) |
| *H01R 13/64* | (2006.01) |

(52) U.S. Cl.
CPC ........ *G06F 11/2289* (2013.01); *G06F 11/0751* (2013.01); *G06F 11/3089* (2013.01); *H05K 7/1455* (2013.01); *H05K 7/1492* (2013.01); *H01R 13/64* (2013.01)

(58) Field of Classification Search
None
See application file for complete search history.

(56) References Cited

U.S. PATENT DOCUMENTS

| | | | |
|---|---|---|---|
| 6,688,910 | B1 | 2/2004 | Macauley |
| 7,063,572 | B2 | 6/2006 | Bandt et al. |
| 7,172,459 | B2 | 2/2007 | Hayashi et al. |
| 7,354,298 | B2 | 4/2008 | James |

(Continued)

OTHER PUBLICATIONS

Office Action in U.S. Appl. No. 14/135,641, dated Feb. 25, 2015, 16 pages.

(Continued)

*Primary Examiner* — Michael Sun
(74) *Attorney, Agent, or Firm* — Steven Chiu, Esq.; Matthew M. Hulihan, Esq.; Heslin Rothenberg Farley & Mesiti P.C.

(57) ABSTRACT

In one or more aspects, a determination is made as to whether a connector is securely fastened, whether the connector connected within a socket structure is the expected connector for that socket structure, and/or whether connectors coupled to one another via one or more cables are properly positioned for communication between them. Information on selected physical connection elements of a connector is used to determine one or more structural characteristics of the cable(s) connected to the connector and to determine whether the connector is the expected connector for a particular socket structure.

11 Claims, 11 Drawing Sheets

(56) References Cited

U.S. PATENT DOCUMENTS

| | | |
|---|---|---|
| 7,666,026 B2 | 2/2010 | Takehara |
| 7,789,714 B2 | 9/2010 | Liu |
| 7,811,119 B2 * | 10/2010 | Caveney ............ H04Q 1/136 439/489 |
| 7,969,320 B2 | 6/2011 | Nordin et al. |
| 8,700,809 B2 * | 4/2014 | Ferragut, II ............ F24C 7/082 251/149 |
| 2005/0071514 A1 | 3/2005 | Anderson et al. |
| 2006/0277324 A1 * | 12/2006 | Aldereguia et al. ............ 710/1 |
| 2007/0022469 A1 * | 1/2007 | Cooper ................ H04K 1/00 726/3 |
| 2007/0184686 A1 | 8/2007 | Hayashi et al. |
| 2010/0035461 A1 | 2/2010 | Berke |
| 2011/0008996 A1 | 1/2011 | Pinn et al. |
| 2012/0003863 A1 | 1/2012 | Sung et al. |
| 2016/0026585 A1 | 1/2016 | Brodsky et al. |

OTHER PUBLICATIONS

Notice of Allowance in U.S. Appl. No. 14/135,641, dated Jul. 6, 2015, pp. 1-8.
Office Action in U.S. Appl. No. 14/877,397, dated Jan. 28, 2016, pp. 1-14.

* cited by examiner

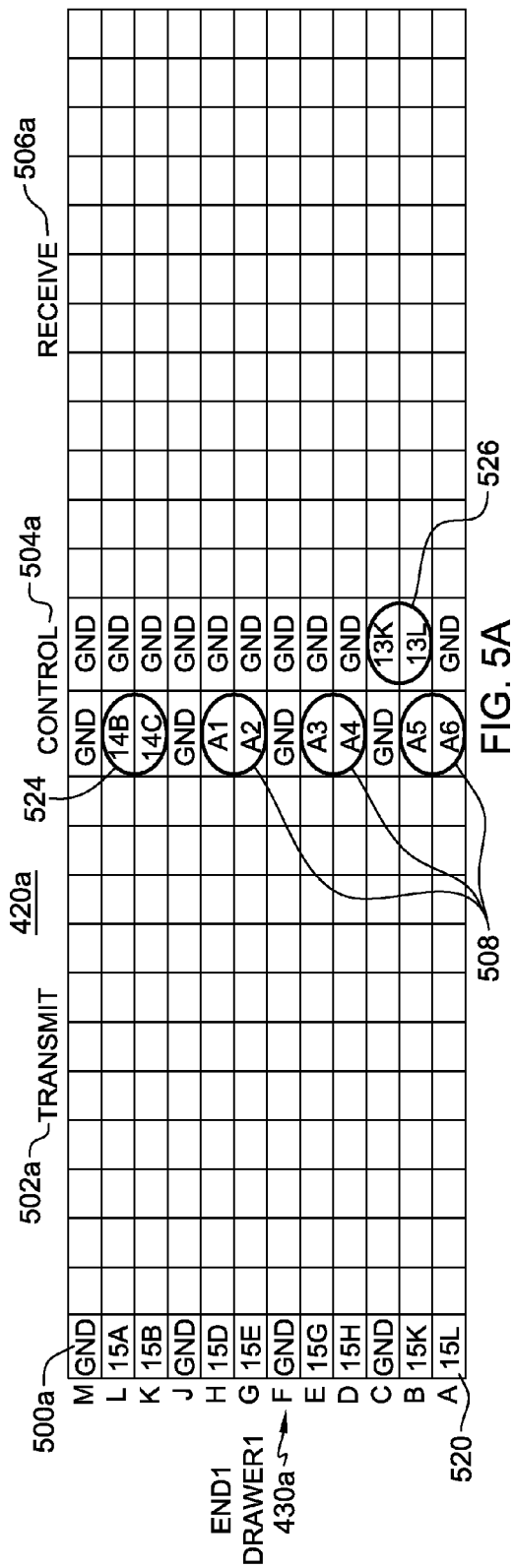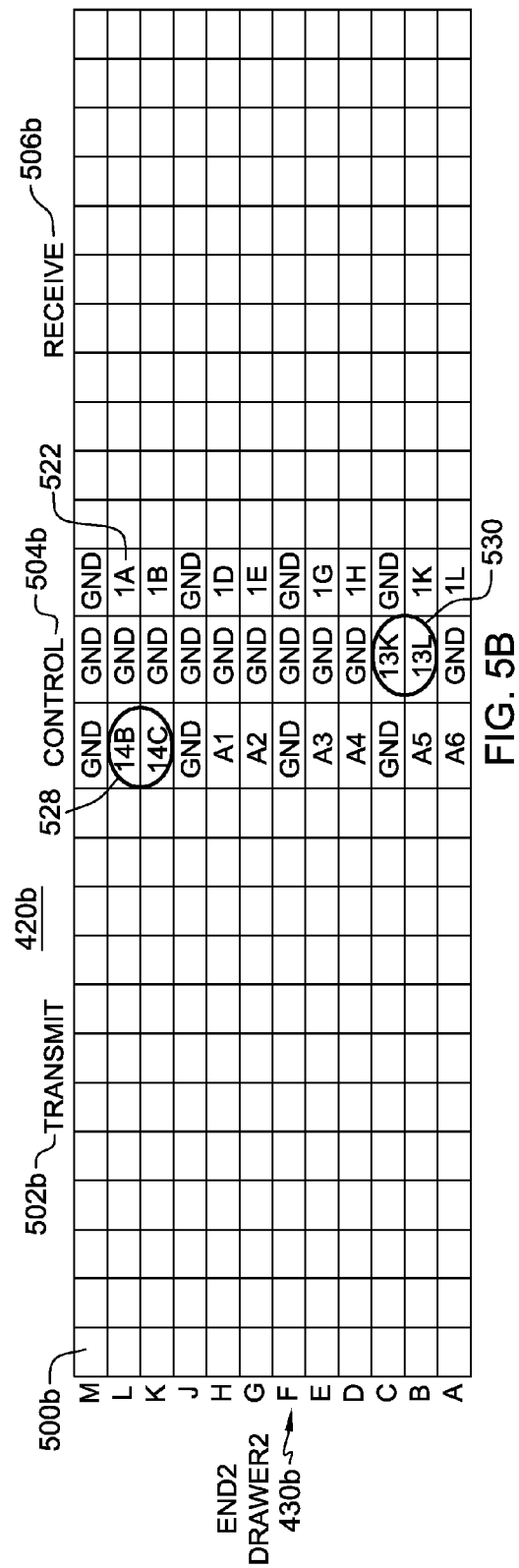

|    | A1 | A2 | A3 | A4 | A5 | LENGTH (M) | A6: PARITY ODD |
|----|----|----|----|----|----|------------|----------------|
| 1  | 0  | 0  | 0  | 0  | 0  | 0          | 1              |
| 2  | 0  | 0  | 0  | 0  | 1  | 0.1        | 0              |
| 3  | 0  | 0  | 0  | 1  | 0  | 0.2        | 0              |
| 4  | 0  | 0  | 0  | 1  | 1  | 0.3        | 1              |
| 5  | 0  | 0  | 1  | 0  | 0  | 0.4        | 0              |
| 6  | 0  | 0  | 1  | 0  | 1  | 0.5        | 1              |
| 7  | 0  | 0  | 1  | 1  | 0  | 0.6        | 1              |
| 8  | 0  | 0  | 1  | 1  | 1  | 0.7        | 0              |
| 9  | 0  | 1  | 0  | 0  | 0  | 0.8        | 0              |
| 10 | 0  | 1  | 0  | 0  | 1  | 0.9        | 1              |
| 11 | 0  | 1  | 0  | 1  | 0  | 1          | 1              |
| 12 | 0  | 1  | 0  | 1  | 1  | 1.1        | 0              |
| 13 | 0  | 1  | 1  | 0  | 0  | 1.2        | 1              |
| 14 | 0  | 1  | 1  | 0  | 1  | 1.3        | 0              |
| 15 | 0  | 1  | 1  | 1  | 0  | 1.4        | 0              |
| 16 | 0  | 1  | 1  | 1  | 1  | 1.5        | 1              |
| 17 | 1  | 0  | 0  | 0  | 0  | 1.6        | 0              |
| 18 | 1  | 0  | 0  | 0  | 1  | 1.7        | 1              |
| 19 | 1  | 0  | 0  | 1  | 0  | 1.8        | 1              |
| 20 | 1  | 0  | 0  | 1  | 1  | 1.9        | 0              |
| 21 | 1  | 0  | 1  | 0  | 0  | 2          | 1              |
| 22 | 1  | 0  | 1  | 0  | 1  | 2.1        | 0              |
| 23 | 1  | 0  | 1  | 1  | 0  | 2.2        | 0              |
| 24 | 1  | 0  | 1  | 1  | 1  | 2.3        | 1              |
| 25 | 1  | 1  | 0  | 0  | 0  | 2.4        | 1              |
| 26 | 1  | 1  | 0  | 0  | 1  | 2.5        | 0              |
| 27 | 1  | 1  | 0  | 1  | 0  | 2.6        | 0              |
| 28 | 1  | 1  | 0  | 1  | 1  | 2.7        | 1              |
| 29 | 1  | 1  | 1  | 0  | 0  | 2.8        | 0              |
| 30 | 1  | 1  | 1  | 0  | 1  | 2.9        | 1              |
| 31 | 1  | 1  | 1  | 1  | 0  | 3          | 1              |
| 32 | 1  | 1  | 1  | 1  | 1  | 3.1        | 0              |

FIG. 5C

VALIDATING CONNECTION, STRUCTURAL CHARACTERISTICS AND POSITIONING OF CABLE CONNECTORS

CROSS-REFERENCE TO RELATED APPLICATIONS

This application is a continuation of co-pending U.S. patent application Ser. No. 14/135,641, filed Dec. 20, 2013, entitled "VALIDATING CONNECTION, STRUCTURAL CHARACTERISTICS AND POSITIONING OF CABLE CONNECTORS," which is hereby incorporated herein by reference in its entirety.

BACKGROUND

One or more aspects relate, in general, to connectors, and in particular, to connection of pluggable-style connectors, such as cable connectors.

Pluggable-style connectors are often used in association with or within electronic systems, such as within an electronics rack, or between racks within a data center. These connectors facilitate electrical and/or communication coupling between the different components of an electronic system, electronics rack or data center. Such connectors, which are generally referred to as cable connectors, facilitate connection of one or more cables to one or more sockets within the electronic system, electronics rack or data center. For instance, cable connectors are widely used to make connections to routers or servers within an electronics rack, where space is often at a premium. In addition to there being little extra space, cable connectors of this type may have the tendency to separate or become partially disconnected from the socket component to which they are connected, particularly if one of more of the associated cables are inadvertently moved or pulled.

BRIEF SUMMARY

Shortcomings of the prior art are overcome and additional advantages are provided through the provision of a method of validating connections of connectors. The method includes, for instance, obtaining from a connector connected to a socket structure, an identifier of a cable coupled to the connector at one end of the cable, the obtaining comprising reading information from a plurality of physical connection elements of the connector to obtain the identifier; determining, based on the identifier, whether a structural characteristic of the cable is an expected structural characteristic for that socket structure; based on determining the structural characteristic of the cable is the expected structural characteristic for that socket structure, continuing validation of connection of the connector; and based on determining the structural characteristic of the cable is not the expected structural characteristic for that socket structure, providing an indication that the connector is not as expected.

Computer program products and systems relating to one or more aspects are also described and may be claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE SEVERAL VIEWS OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 5A depicts one embodiment of further details of a connector apparatus of FIG. 4B, including the plurality of connection elements;

FIG. 5B depicts one embodiment of further details relating to another connector apparatus of FIG. 4B, including the plurality of connection elements;

FIG. 5C depicts one example of identification assignments of certain connection elements of the connector apparatuses of FIG. 4B;

DETAILED DESCRIPTION

Figure 1:
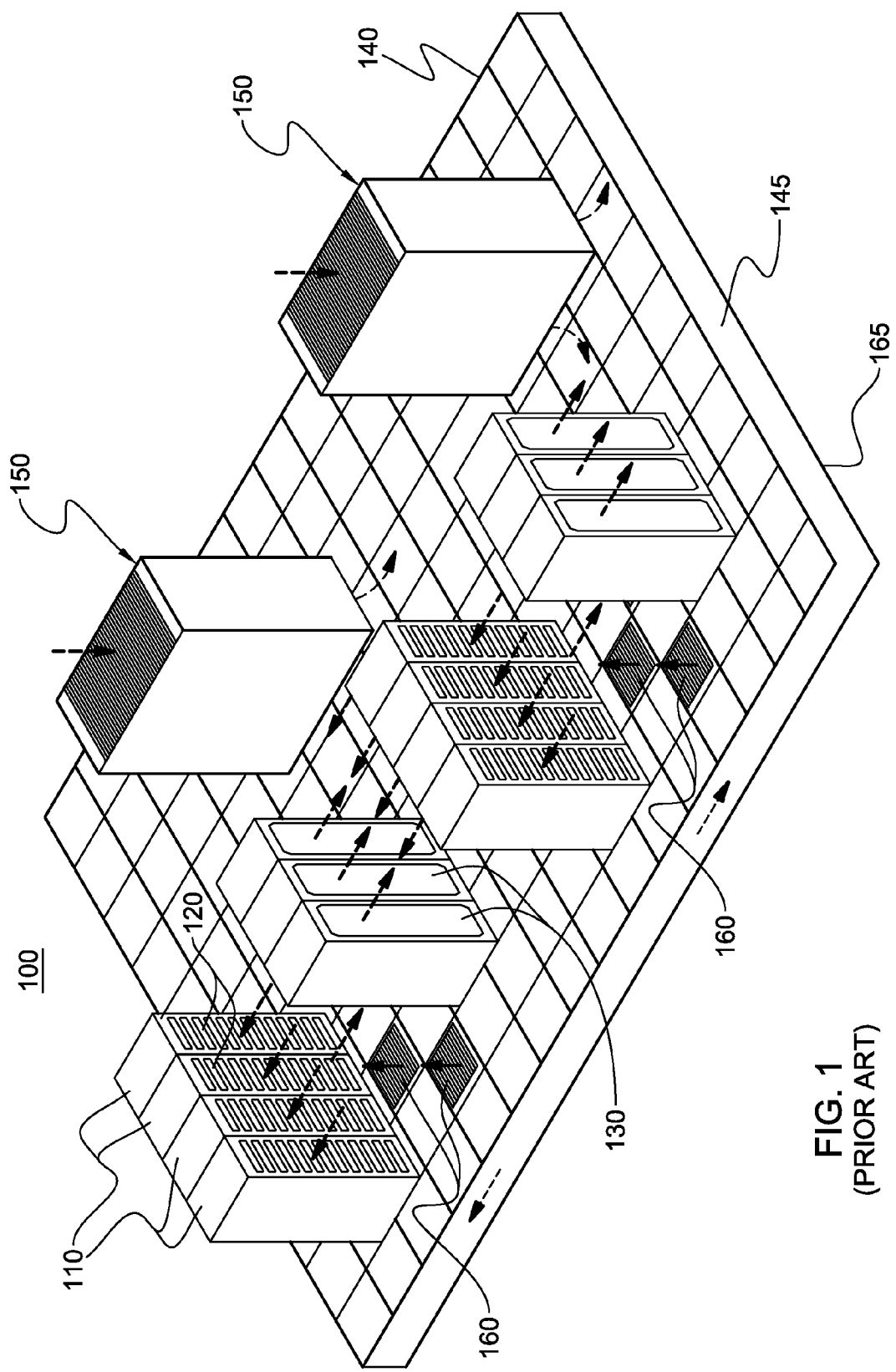
FIG. 1 depicts one embodiment of a conventional raised floor layout of a data center containing multiple electronics racks.

In accordance with one or more aspects, a capability is provided to determine whether a connector is securely fastened, whether the connector connected within a socket structure is the expected connector for that socket structure, and/or whether connectors coupled to one another via one or more cables are properly positioned (i.e., engaged in the correct socket structures) for communication between them. In one example, information on selected physical connection elements of a connector is used to determine one or more structural characteristics of the cable(s) connected to the connector and to determine whether the connector is the expected connector for a particular socket structure.

As used herein, the terms "electronics rack" and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled. As one specific example, the electronics rack may be an IT Enterprise Computer System, implemented, for example, employing System z server units, or System p server units, offered by International Business Machines Corporation. SYSTEM Z and SYSTEM P are registered trademarks of International Business Machines Corporation, Armonk, N.Y. Other names used herein may be registered trademarks, trademarks or product names of International Business Machines Corporation or other companies.

Further, as used herein, "socket structure" comprises any socket, port, or connector of, for instance, an electronic system, configured to accommodate one or more connectors or connector apparatuses, such as disclosed herein. The socket structure may be a discrete structure, or may include (for instance) a portion of a housing within which the socket resides. As used herein, a "connector" refers to any connect structure or assembly characterized as disclosed herein, with a cable connector or multi-cable connector being examples of a connector which may be part of a connector apparatus. As used herein, a connector may be any of a variety of connectors, such as an electrical, electronic, or communication connector, etc.

Reference is made below to the drawings, which are not drawn to scale for ease of understanding, wherein the same reference numbers used throughout different figures designate the same or similar components.

FIG. 1 depicts a raised floor layout of a data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at the front (i.e., air inlet sides 120) of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110. Each electronics rack typically contains one or more electronic systems which utilize interconnecting cables with associated cable connectors.

Figure 2:
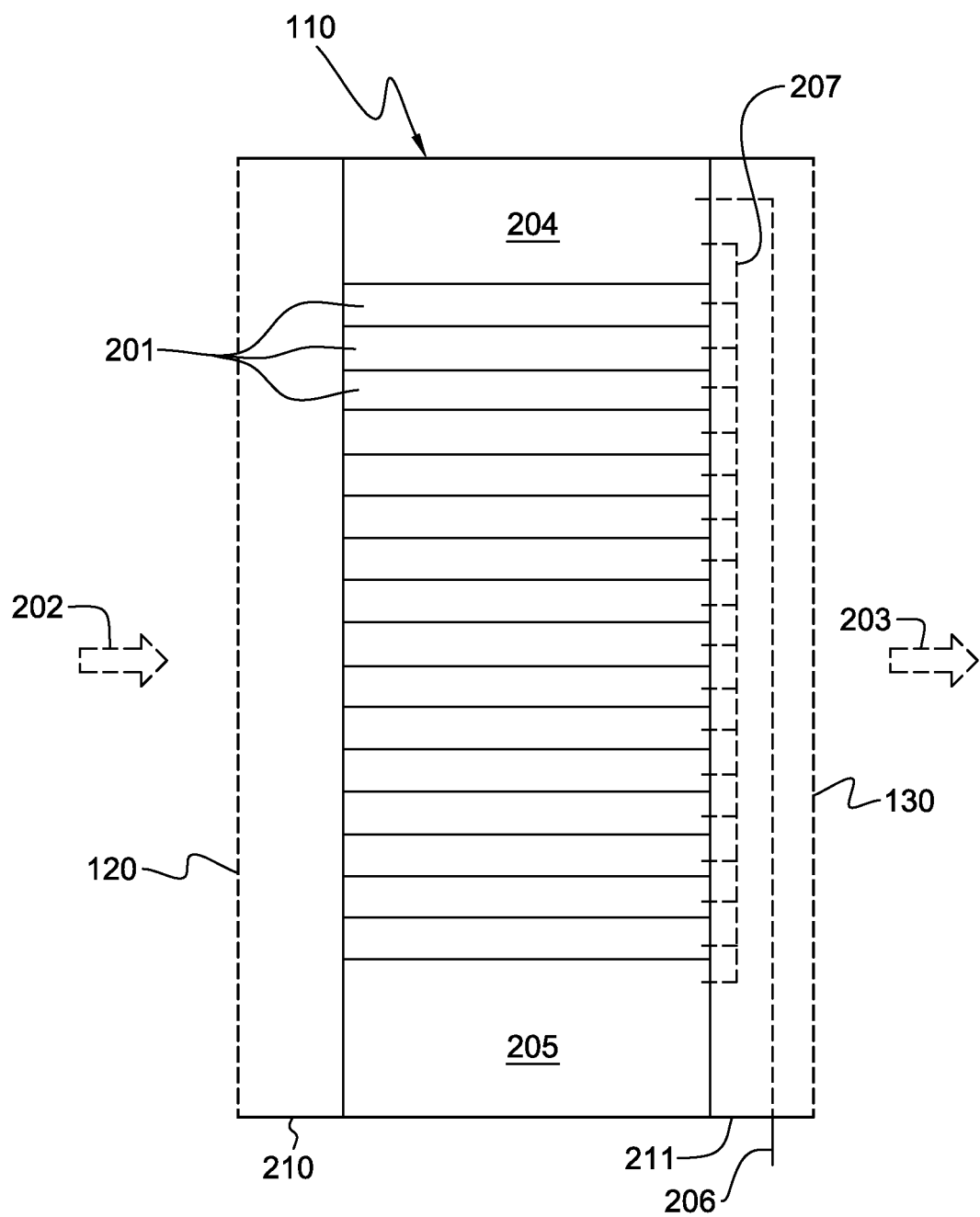
FIG. 2 is a cross-sectional elevational view of one embodiment of an electronics rack comprising, in one example, one or more electronic systems/subsystems having socket structures which accommodate one or more connector apparatuses.

FIG. 2 is an elevational representation of one embodiment of an electronics rack 110. In the embodiment shown, electronics rack 110 includes a plurality of electronic systems 201, which (in the embodiment illustrated) may be air-cooled by cool air 202 ingressing via louvered air inlet door 210, and exhausting out louvered air outlet door 211 as hot air 203. Electronics rack 110 also includes (in one embodiment) at least one bulk power assembly 204. One or more electronic systems 201 include, in one example, one or more processors, associated memory, input/output devices or adapters and disk storage devices. Also illustrated in FIG. 2 is an I/O and disk expansion subsystem 205, which includes, in one detailed example, PCIe (Peripheral Component Interconnect express) card slots and disk drivers for one or more electronic systems of the electronics rack. Note that I/O and disk expansion subsystem 205 could be disposed anywhere within electronics rack 110, with the positioning shown in FIG. 2 being provided as one example only. For example, the I/O and disk expansion subsystem 205 could alternatively be disposed in the middle of the electronics rack, if desired.

In one rack example, a three-phase AC source feeds power via an AC power cord 206 to bulk power assembly 204, which transforms the supplied AC power to an appropriate DC power level for output via distribution cables 207 to the plurality of electronic systems 201. AC power cord 206 supplies, in one example, three phase electrical power. The number and type of electronic systems installed in the electronics rack are variable and depend on customer requirements for a particular system.

Figure 3:
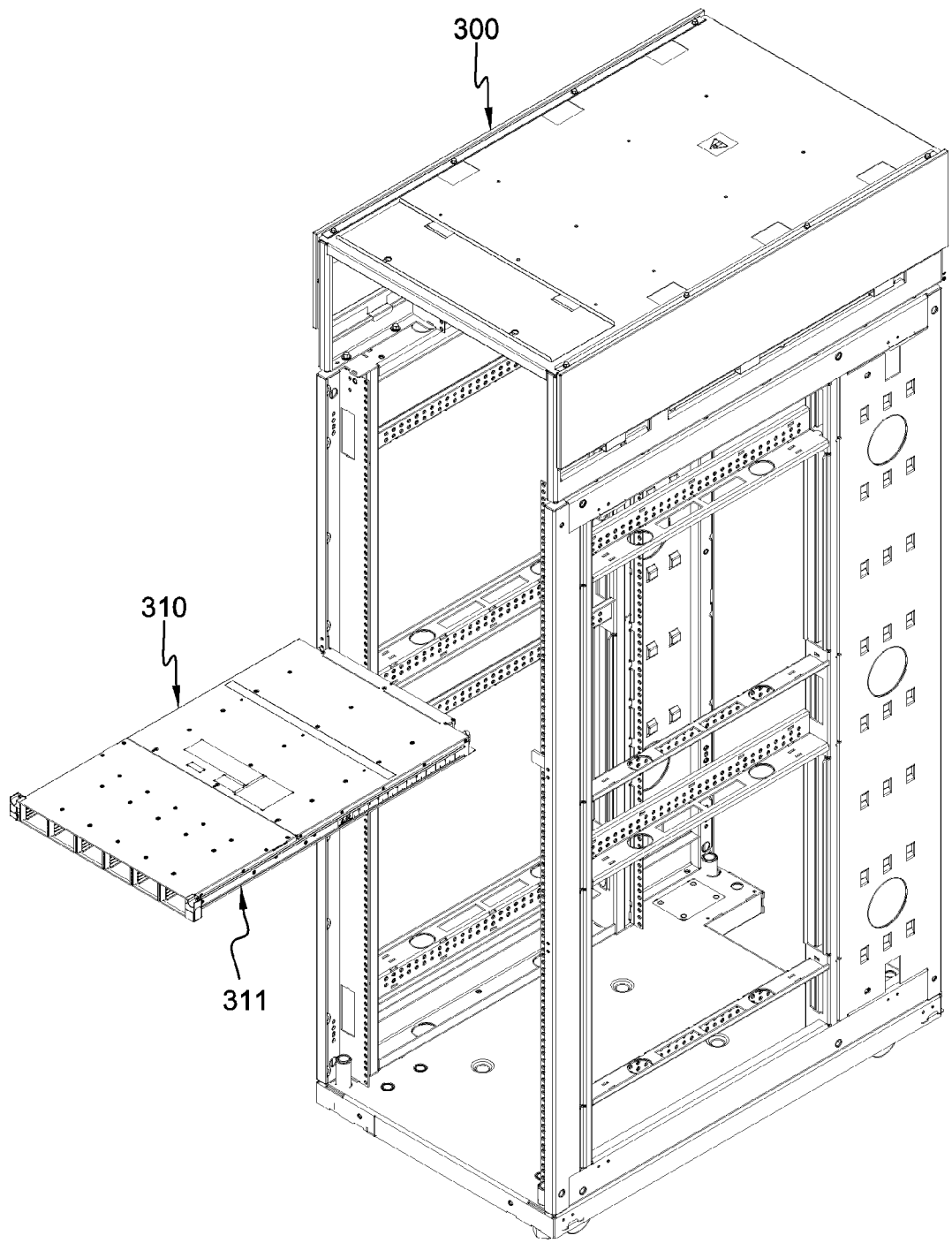
FIG. 3 depicts one embodiment of a rack frame and an electronic system comprising a housing including, at least in part, one or more socket structures which accommodate one or more connector apparatuses.

As illustrated in FIG. 3, in one embodiment, an electronic assembly may comprise a rack frame 300, which accommodates one or more electronic systems, with one electronic subsystem 310 being illustrated by way of example. Electronic subsystem 310 comprises an enclosure 311 configured to accommodate, in one example, a plurality of field-replaceable units, which slidably dock within respective field-replaceable unit (FRU)-receiving slots at one end of enclosure 311. Within rack frame 300, for instance, between multiple electronic subsystems 310, one or more cables, such as one or more electrical, electronic, or communication cables, may need to be connected. Dedicated socket structures may be provided for cable connectors to be operatively attached. The socket structures may facilitate coupling to, for instance, a mid-plane or back-plane of the electronic system to which connection is being made. Depending upon the implementation, cable connectors may be employed to facilitate connection to or between routers, servers, input/output devices, adapters, etc., within an electronics rack or between electronics racks of a data center. Oftentimes, there is little extra space within or around the socket structures configured to accommodate the cable connectors. Depending upon the implementation, it may be difficult for an operator to confirm docking or seating of a cable connector within a respective socket.

A connector apparatus is provided which compensates for limited access by providing, in one aspect, a mechanical connect-assist mechanism that facilitates mechanical plugging of the connector within the respective socket structure, and which facilitates retaining of a connector in seated position within the socket structure, and that provides positive feedback features which allow an operator to readily verify that a connector is in a seated position within the socket structure. Additionally, cable support features may be integrated within the connector apparatus.

Generally stated, in one embodiment, a connector apparatus is provided which includes a connector configured to operatively plug into a socket structure, and a mechanical connect-assist mechanism associated, at least in part, with the connector. The mechanical connect-assist mechanism includes a cam shaft rotatably coupled to the connector, and a connect-assist element projecting from the rotatable cam shaft. The connect-assist element is configured to engage at least one element-receiving opening associated with the socket structure with insertion of the connector within the socket structure to facilitate, for instance, caming of the connector into the socket structure. In particular, rotating of the rotatable cam shaft moves the connect-assist element within the at least one element-receiving opening to facilitate secure seating and retention of the connector within the socket structure.

In certain aspects, the connect-assist element may extend through the rotatable cam shaft, and be sized and configured to engage a first element-receiving opening associated with the socket structure, and a second element-receiving opening associated with the socket structure, wherein the first and second element-receiving openings are disposed on opposite sides of the connector as the connector is inserted into the socket structure. With insertion of the connector into the socket structure, rotating of the rotatable cam shaft moves the connect-assist element within the first element-receiving opening and the second element-receiving opening, and the first element-receiving opening and the second element-receiving opening are configured so that movement of the connect-assist element therein facilitates drawing the connector into a seated position within the socket structure and retaining the connector in the seated position within the socket structure. By way of example, the connect-assist element may be a rod extending through the rotatable cam shaft, for instance, transverse to the rotatable cam shaft. In one implementation, the first element-receiving opening and the second element-receiving opening each extend at an angle to an axis of insertion of the connector into the socket structure, and are mirror image openings within the socket structure or associated housing of the socket structure.

As enhancements, the mechanical connect-assist mechanism may include one or more visual indicators of connection status, such as a visual indicator which indicates with insertion of the connector into the socket structure and rotating of the rotatable cam shaft whether the connector is unseated or the connector is seated within the socket structure.

Additionally, the mechanical connect-assist mechanism may further include a spring engaging the rotatable cam shaft with a detente or notch in the spring configured to be engaged by a cam lobe associated with the rotatable cam shaft. The cam lobe engages, at least in part, the detente, with seating of the connector within the socket structure to provide tactile feedback of connector seating within the socket structure to an operator. This cam lobe may be a first cam lobe associated with the rotatable cam structure, and the mechanical connect-assist mechanism may further include a second cam lobe associated with the rotatable cam shaft, wherein the second cam lobe engages the detente with connector unseating from the socket structure to provide an operator with tactile feedback of unseating of a previously seated connector. Upon the second cam lobe engaging the detente, the connect-assist element has moved to an unseated position relative to the element-receiving opening associated with the socket structure. This tactile feedback of connector seating or connector unseating facilitates operator plugging or unplugging of the connector into the socket structure where space is limited and, for instance, a sight-line to the connector and/or socket structure may be impaired or even blocked.

By way of example, the connector may be a cable connector that is attached to one or more cables for use, for instance, within an electronic system or between electronic systems. In such a case, the socket structure may be associated with a housing which may include one or more electronic components of the electronic system. The connector may further comprise an enclosure which, in one embodiment, includes tapered connect-supports on one or more outer surfaces thereof which are configured to engage one or more surfaces of the socket structure (or housing associated with the socket structure) with seating of the connector within the socket structure, to facilitate retention of the connector in seated position within the socket structure and support of the one or more cables attached to the cable connector.

As a further enhancement, the one or more surfaces associated with the socket structure engaged by the tapered connector-supports of the connector enclosure may itself or themselves include tapered supports sized and configured to, for instance, engage or interlock with the tapered connector-supports of the connector enclosure with seating of the connector within the socket structure to further facilitate retention of the connector in seated position within the socket structure, and support the cable(s) to which the cable connector is attached.

In one embodiment, the connector apparatus includes a mechanical connect-assist or plug mechanism which facilitates caming of the connector into and out of operative engagement with a socket structure, and which provides positive feedback to ensure that the connector is fully seated. In addition, the mechanical connect-assist mechanism and associated socket structure include built-in supports that, for instance, overcome the cable weight, to facilitate preventing a seated connector from becoming unseated. In the connector apparatus, the space available to control the cables and/or cable connectors may be very limited. For instance, side-to-side symmetric multiprocessing (SMP) cable connectors are often closely packed, and above the connectors can be an overhanging input/output adapter cage, and below, another node (or cage), and to the front of the structure are the cable bundles that are attached to the cable connectors. Therefore, there is limited space to add hardware around or in front of the socket structures or connector assemblies. Thus, the connector apparatuses provide a compact design which provides, in part, visual verification, as well as tactile feedback, that a cable connector is in seated position within a respective socket structure.

Figure 4A:
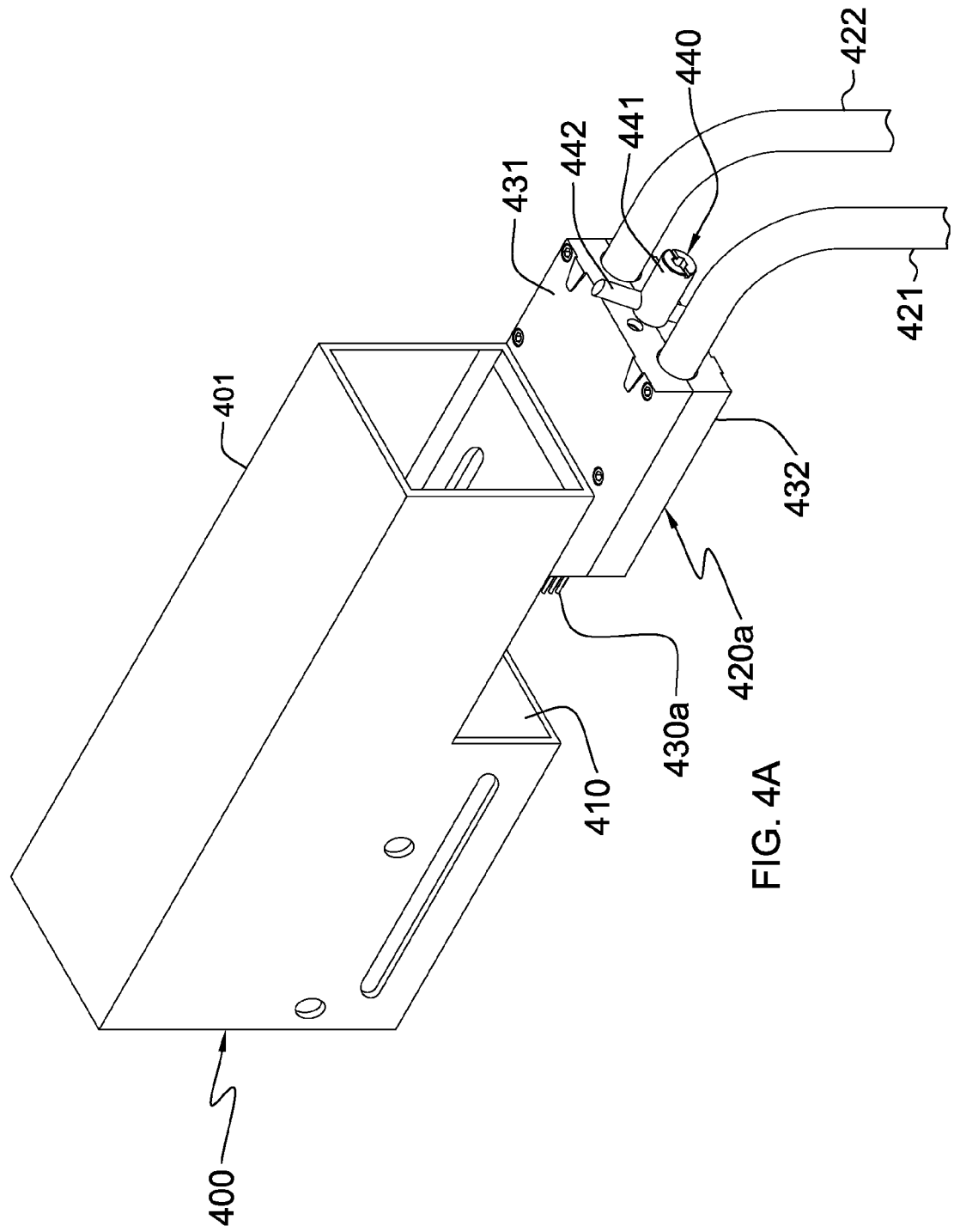
FIG. 4A is a partial isometric view of one embodiment of an electronic subsystem, and a connector apparatus comprising a cable connector and a mechanical connect-assist mechanism.

FIG. 4A depicts, by way of example, a portion of one embodiment of an electronic system or subsystem (e.g., a drawer), generally denoted 400, which includes a housing or cage 401. By way of specific example, housing 401 may be configured for insertion of one or more devices, such as one or more input/output adapters, and reside within an electronics rack such as described above in connection with FIGS. 2 & 3. Electronic system 400 includes, again by way of example only, a socket structure 410 defined within housing 401 which receives a connector 420a that facilitates electrical, optical, electronic, and/or communication connection, etc., to or from the electronic system. In this embodiment, connector 420a is a cable connector, and in particular, a multi-cable connector, which is shown to facilitate connection of a first cable 421 and a second cable 422 to socket structure 410. Connector 420a includes an upper enclosure (or housing) 431 and a lower enclosure (or housing) 432 which attach together to define the connector enclosure. In one embodiment, connector 420a includes a plurality of connection elements 430a, which are sized and configured to operatively couple to corresponding connection structures (not shown) within socket structure 410.

Also illustrated in FIG. 4A is one embodiment of a mechanical connect-assist mechanism 440. This mechanical connect-assist mechanism is shown to include a cam shaft 441 rotatably coupled to connector 420a, and a connect-assist element 442 which projects from rotatable cam shaft 441.

Further details regarding connector 420a are described with reference to FIGS. 4B and 4C. As shown, in one example, connector 420a includes, for instance, a connection assembly 460 (FIG. 4C) disposed, in part, within an appropriately sized opening 462 in lower enclosure 432. A plurality of screws or bolts 464 may be used to secure the connector apparatus together, that is, to secure an upper enclosure 431 and lower enclosure 432 in the manner illustrated. As described herein, tapered connector-supports 445 (FIG. 4B) may be provided in one or more surfaces of the connector enclosure to facilitate, for instance, secure retention of the connector in a seated position within the socket structure, and in so doing, relieve stress on the connector due to gravity from the one or more cables 421, 422 attached to the cable connector.

The mechanical connect-assist mechanism 440 is shown to include the rotatable cam shaft 441 and connect-assist element 442 which, in one embodiment, is a rod which extends through the rotatable cam shaft 441, for example, transverse to the rotatable cam shaft 441. The rotatable cam shaft resides (in this example) at the interface of the upper enclosure 431 and lower enclosure 432, and the connect-assist element includes, for instance, a spring with a detente (or notch, relief, etc.) disposed herein. The rotatable cam shaft 441, in one embodiment, rests on or engages the spring within the connector.

The plurality of connection elements 430a extend within the connection assembly 460 for protection from physical damage and for facilitating operative connection to corresponding connection structures of the socket structure (see FIG. 4A). Connection elements 430a may be any of a variety of conventional connection elements, including pins, cards, contacts, etc., designed to interface the one or more cables 421, 422 to the socket structure.

Figure 4B:
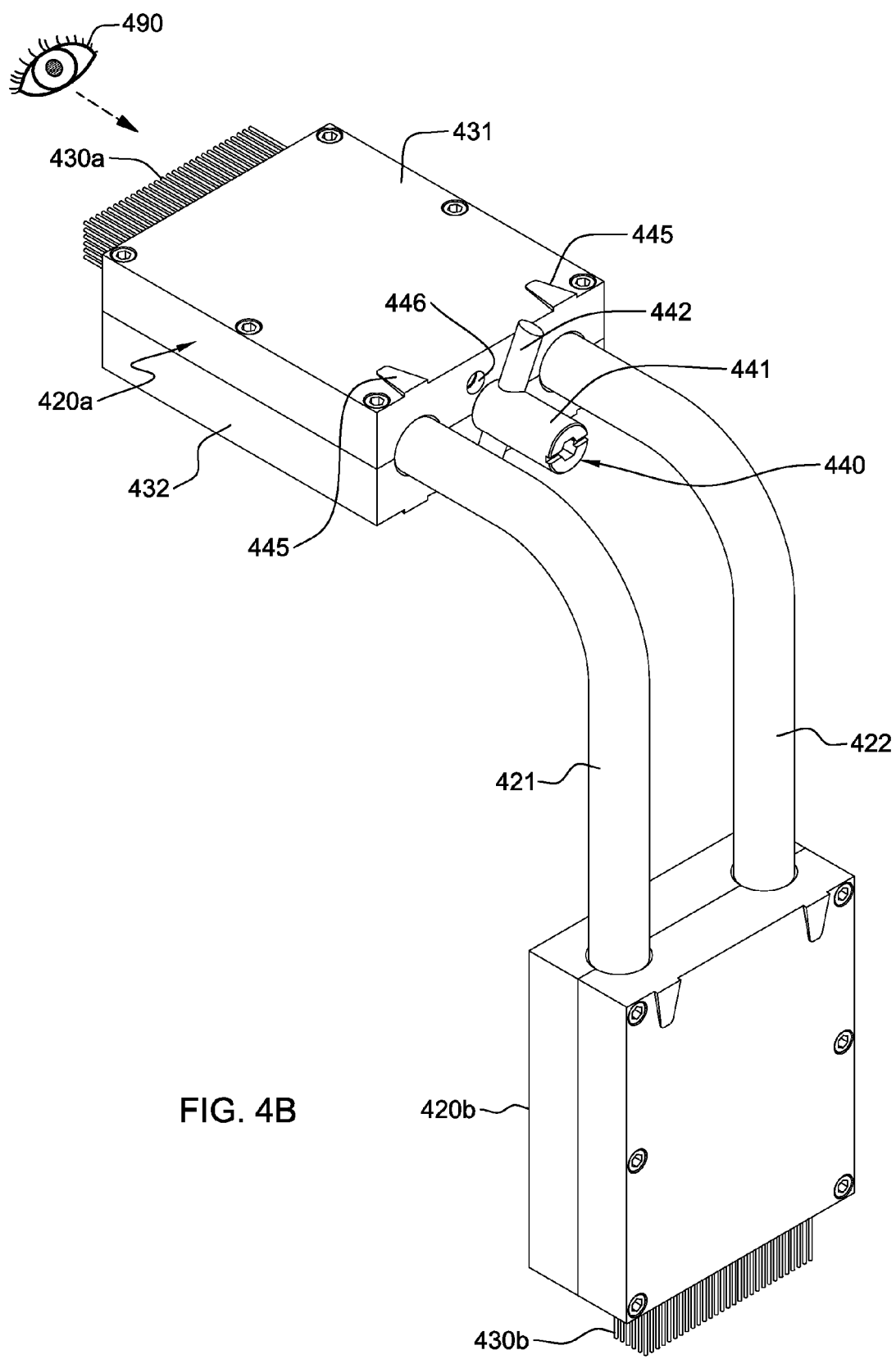
FIG. 4B is an enlarged depiction of the connector apparatus of FIG. 4A, which is coupled to another connector apparatus, each connector apparatus comprising a plurality of connection elements.
Figure 4C:
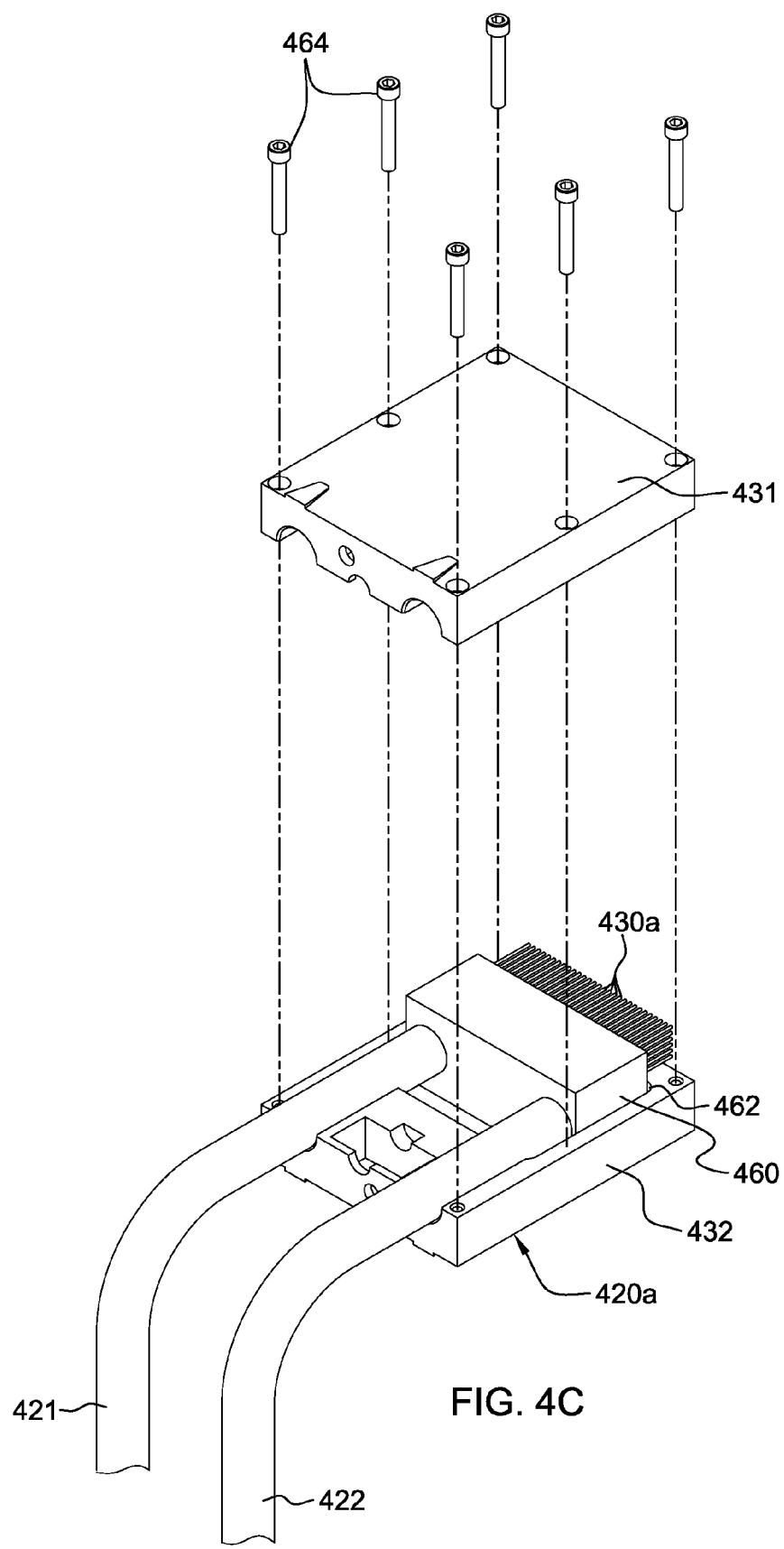
FIG. 4C is a partially exploded view of one embodiment of a connector apparatus of FIG. 4B.

In the illustration of FIG. 4B, one or more cables 421, 422 are also connected to another connector 420b, which is similar in structure to connector 420a. Connector 420b, similar to connector 420a, includes a connect-assist mechanism (not shown), as well as a plurality of connection elements 430b to facilitate connection within a socket structure of, for instance, another electronic system. Further details regarding connectors 420a, 420b and connection elements 430a, 430b are described with reference to FIGS. 5A-5B.

FIG. 5A depicts one example of connector 420a viewed from an end of connector 420a looking into connection elements 430a (see 490 of FIG. 4B). Referring to FIG. 5A, connector 420a includes a plurality of wafers 500a, wherein a first portion (e.g., 12) of the plurality of wafers comprises a transmit region 502a, a second portion (e.g., 2) of the plurality of wafers comprises a control region 504a, and a third portion (e.g., 12) of the plurality of wafers comprises a receive region 506a. Each wafer 500a includes a portion of the plurality of connection elements 430a (e.g., labeled A-H, J-M). For instance, each wafer includes, in this example, 12 connection elements, also referred to as electrical contacts (e.g., pins). Thus, each column of connection elements in FIG. 5A is a wafer, and there are, for example, 12 transmit wafers, 2 control wafers, and 12 receive wafers. In other embodiments, there may be more or fewer wafers altogether, and/or more or fewer wafers per transmit, control and/or receive region; more or fewer connection elements per wafer; and/or the regions may be in a different order. Other variations are also possible.

In accordance with one aspect, the connection elements of the transmit region and the receive region are of a first size in length, and the connection elements of the control region are of a second size in length. The second size is shorter than the first size, in this example. For instance, the connection elements of the transmit region and the receive region are 4.9 mm in length, while the connection elements of the control region are 4.5 mm in length. Thus, the connection elements of the transmit region and the receive region connect prior to the connection elements of the control region. In a further embodiment, the connection elements of the control region may be longer than the connection elements of the transmit region and/or the receive region. Further, in other embodiments, the connection elements of all three regions may be of different sizes, or portions of regions may be of differing sizes. Other variations also exist.

In this embodiment, selected connection elements of the control region of the connector also provide an identifier for the one or more cables connected to the connector. For instance, multiple connection elements 508 have a binary value (e.g., a 0 or 1) assigned thereto, and by reading the values in a sequential order, an identifier with odd parity is provided. One example of assigned identifiers is provided in FIG. 5C.

Referring to FIG. 5C, in this example, the identifiers are assigned based on the length of the cable(s) attached to the connector. For instance, if a 0.3 meter cable is to be attached, then an identifier of 00011 (which is equal to 3 in decimal) with an odd parity bit of 1 is provided (see row 4 of FIG. 5C). As a further example, if a 2.0 meter cable is to be attached, then an identifier of 10100 (which is equal to 20 in decimal) with an odd parity bit of 1 is provided (see row 21). In this embodiment, the identifier 00000 with an odd parity bit of 1 indicates a cable that is not to be used (e.g., it is only for manufacturing/testing, etc.).

Each cable connected to the connector has the same identifier, in this example. Further, in this embodiment, the cables are connected to one connector (e.g., 420a) at one end of the cables, and connected at the other end of the cables to another connector (e.g., 420b). The other connector is structurally similar to the first connector, as seen in FIG. 5B.

Referring to FIG. 5B, connector 420b, which is of an another electronic subsystem, also includes a plurality of wafers 500b, each including a plurality of connection elements 430b. A first portion (e.g., 12) of the plurality of wafers 500b comprises a transmit region 502b, a second portion (e.g., 2) of the plurality of wafers comprises a control region 504b, and a third portion (e.g., 12) of the plurality of wafers comprises a receive region 506b. Further, selected connection elements of the control region of connector 420b (e.g., elements labeled A1-A6 in FIG. 5B) also provide an identifier for the one or more cables connected to the connector. This identifier would be the same as the identifier provided by elements 508 in FIG. 5A, since it is the same cable(s).

When the cables are connected at both ends to the connectors, and the connectors are engaged in the socket structures, connection elements in the transmit region of one connector are electrically connected to connection elements in the receive region of another connector in a prescribed manner. For instance, connection element 1A (520) of the transmit side of connector 420a is electronically connected to connection element 522 (15 L) on the receive side of connector 420b. Other elements are similarly connected.

Additionally, in one embodiment, each connector includes a selected plurality of connection elements, referred to as topology contacts, that are used to determine whether the connectors, when engaged in their respective sockets, can communicate with one another. In this particular embodiment, connection elements 524 and 526 of connector 420a and connection elements 528 and 530 of connector 420b are the selected topology contacts. In other embodiments, other contacts and/or additional contacts may be selected.

As indicated, the connectors are plugged into or engaged into respective socket structures. In a system, there is typically a plurality of socket structures in which each connector may be connected. For instance, there may be 6 connectors per electronics system and 4 electronics systems. Thus, in such a system, there are 24 socket structures in which to engage a connector. Therefore, in accordance with one or more aspects, capabilities are provided to validate that a connector is connected in the correct position (i.e., the correct socket structure), fully engaged, and able to communicate with another connector coupled thereto via one or more cables. In one embodiment, the length of selected connection elements (e.g., pins) is used to determine whether the connection is fully connected, as described below. Further, in another aspect, information is built into selected physical connection elements (i.e., physical contacts) that is used to identify one or more structural characteristics of the cable(s) connected to the connector (e.g., the length of the cable), which is then used to determine whether the connector is engaged in the correct socket structure. The information defines, for instance, the electrical characteristics of the cable that is expected, enabling component drivers and receivers (not shown) to be set appropriately. Although in the example described herein, the structural characteristic that is identified is cable length, there are many other possibilities, including but not limited to, cable performance (e.g., bandwidth), cable personality or type (e.g., details of the interconnect), cable speed, etc.

Yet further, a particular sequence, in one example, is provided in which the connection is validated, identification is performed, and a handshaking between the transmit and receive regions is provided to ensure that the connection is proper, all prior to starting the bus to communicate data. Although in one embodiment described herein a particular sequence is provided, in other embodiments, the sequence may differ.

Figure 6:
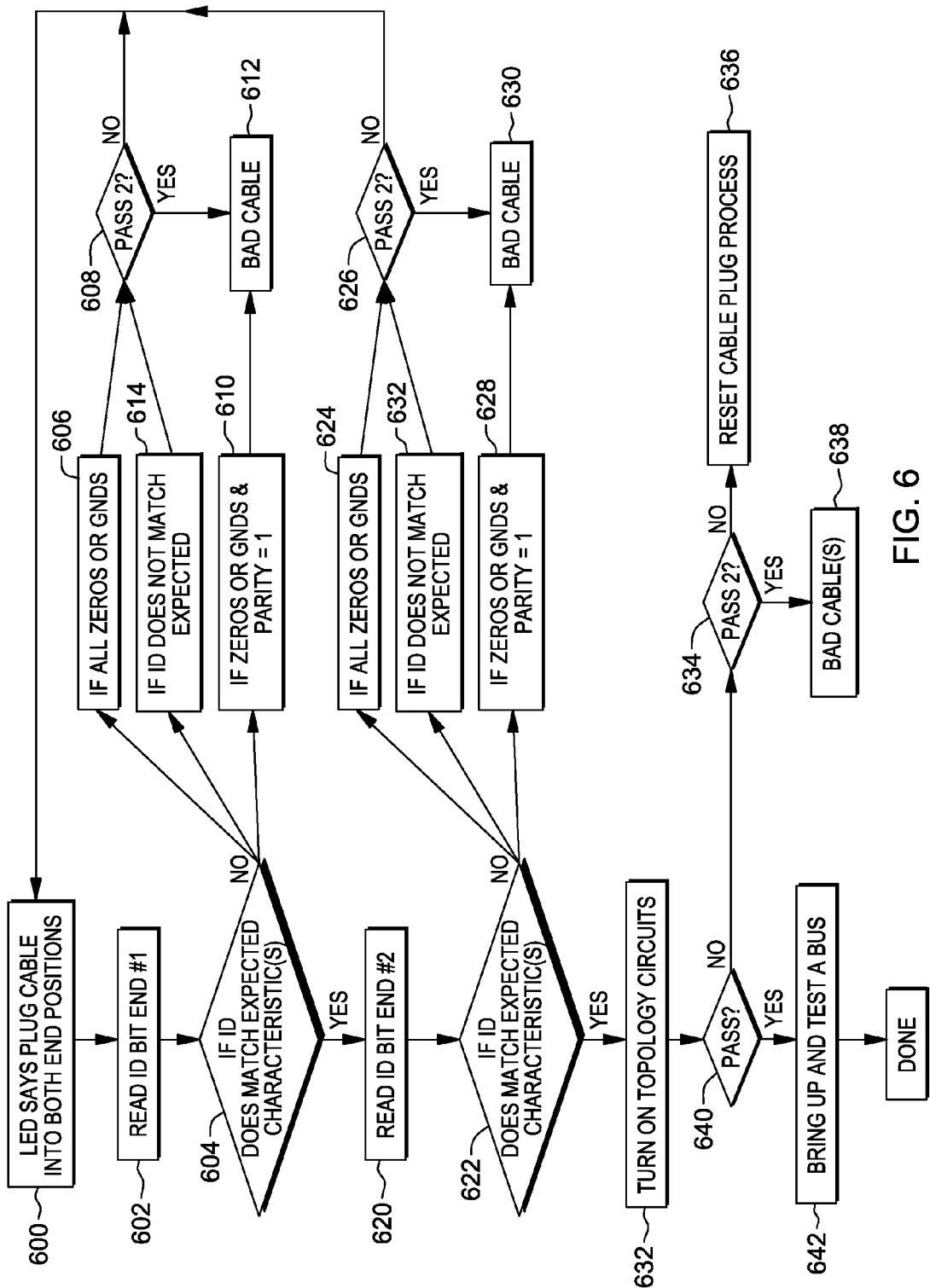
FIG. 6 depicts one embodiment of the logic to validate the connection, structural characteristics and positioning of connector apparatuses.

One embodiment of a particular sequencing used to ensure the connectors are fully engaged in the correct socket structures, based on identifying structural characteristics of the cable(s) connected thereto, and to ensure proper communication between the connectors at either end of the cables is described with reference to FIG. 6. Initially, an operator (e.g., a service person) arrives at a rack, for instance, and indicates that a cable, having a particular identifier, is to be installed. For instance, the operator enters information at a service processor on the rack. The service processor, referred to herein as a global service processor, turns on an LED at each end indicating where the connectors having such a cable are to be installed, STEP 600. The operator installs the connectors using the locking mechanism on each connector to lock them in place. Thereafter, the global service processor orchestrates a sequencing to determine proper installation. For instance, the global service processor initiates a process on a local service processor of one electronics system/subsystem to which one of the connectors is being installed. The process includes reading in a particular sequence, by the local service processor, the information (e.g., binary values) provided on connection elements 508 of the connector coupled to this electronic system to obtain an identifier of the cable(s) connected to the connector, STEP 602. In a further embodiment, instead of the global service processor initiating the reading of the identifier, the local service processor automatically initiates the read process based on determining the connector has been engaged.

A determination is made as to whether the identifier obtained from reading the information in the control region of the connector indicates that a structural characteristic (e.g., length) of the cable connected to the connector is the structural characteristic expected by the socket structure in which the connector is engaged, INQUIRY 604. This determination is made by, for instance, checking a table or other data structure that indicates the expected structural characteristics for a cable to be plugged into this socket structure. For instance, the identifier is compared to an identifier assigned to this socket structure that is in the table, or in another example, a result of adding the binary values of the identifier provides a length and that length is compared to a length specified in the table for the socket structure. Other examples are possible.

If the identifier does not indicate structural characteristics that match the expected characteristics, then a further determination is made as to whether the identifier is all zeros or all grounds, INQUIRY 606. If it is all zeros or grounds, then it is determined that the contacts of the connector, and in particular, in this example, the control region, are not fully engaged. Therefore, a determination is made as to whether this was a second pass through this logic, INQUIRY 608. If not, then the operator is provided an indication to reinstall the cable, STEP 600. However, if it is the second pass through the logic, then the cable is indicated as bad, STEP 612. In one embodiment, the determined reason that the cable is bad is provided to the operator. This reason may include the identifier (e.g., all zeros) and/or it may include a reason determined based on the identifier (e.g., not functioning properly), as examples.

Returning to INQUIRY 604, if the identifier does not indicate expected structural characteristics and it is not all zeros or grounds, then a further determination is made as to whether the identifier is all zeros or grounds with a parity bit equal to one, INQUIRY 610. If it is all zeros or grounds with a parity bit equal to one, then an indication is provided that the cable is bad, STEP 612. In this case, the identifier (e.g., 00000 with an odd parity of 1 identifies a cable only to be used in manufacturing (e.g., testing) and not to be used in the field). Thus, it is indicated as a bad cable. As before, in one embodiment, the determined reason (e.g., the identifier and/or reason based on the identifier) that the cable is bad is provided to the operator.

Returning once again to INQUIRY 604, if the identifier does not indicate structural characteristics that match the expected characteristics and it is not all zeros or grounds, and it is not all zeros or grounds with parity equal to one, then there is a mismatch and the connector may be in an incorrect socket structure, STEP 614. However, before making a determination of whether the connector is in an incorrect socket structure, the operator is given a chance to re-plug the connector to see if the re-plugging addresses the issue. Thus, a further determination is made as to whether it is the second pass, INQUIRY 608. If not, then processing continues with STEP 600, in which the connector is re-plugged into, for instance, the same socket structure. Otherwise, an indication is made that it is a bad cable (e.g., the cable does not have the structural characteristics (e.g., length) supported by the socket structure in which it was connected), STEP 612. Thus, in one embodiment, the operator is notified of the bad cable, and thus, may attempt to reconnect the connector in another socket structure. In one example, the local service processor can query other socket structures in the system to determine if this connector is signaling another socket structure. In other embodiments, the operator may replug based on a signal provided by the local service processor or the global service processor; by trial and error; or based on other techniques.

Returning to INQUIRY 604, if the identifier identifies expected structural characteristics for the socket structure engaging the connector, this is communicated to the global service processor, which in turn, instructs the local service processor of the electronics system/subsystem on the other end of the cable to read its identifier (e.g., A1-A6 of FIG. 5B), STEP 620. (In a further embodiment, the global service processor is not involved, but instead, the second identifier is read, for instance, when the connector is plugged in). Responsive to reading the second identifier, the second local service processor determines whether the identifier indicates that a structural characteristic of the cable connected thereto is the structural characteristic supported and expected by the socket structure engaging the connector, INQUIRY 622. If the identifier does not indicate structural characteristics that match the expected characteristics and if it is all zeros or grounds (e.g., not fully contacted), INQUIRY 624, and it is not the second pass, INQUIRY 626, then processing continues with STEP 600 in which the connector is re-plugged into the same socket structure. Otherwise, if it is the second pass, the cable is indicated as bad, as described above, STEP 630.

Further, if the identifier does not indicate structural characteristics that match the expected characteristics, INQUIRY 622, and it is not all zeros or grounds, but it is all zeros or grounds with a parity equal to one, INQUIRY 628, then an indication is provided of a bad cable (e.g., cable meant for manufacturing/testing only), as described herein, STEP 630. Yet further, if the identifier does not indicate structural characteristics that match the expected characteristics, INQUIRY 622, and it is not all zeros or grounds, and it is not all zeros or grounds with a parity equal to one, then there is a mismatch and the connector may be in an incorrect socket structure, STEP 632. A determination is made as to whether it is the second pass, INQUIRY 626. If it is not the second pass through the logic, then processing continues with STEP 600 in which, for instance, the connector is re-plugged into the socket structure; otherwise, processing continues with an indication of a bad cable (e.g., the cable does not have the structural characteristics (e.g., length) supported by the socket structure in which it was connected), as described herein, STEP 630. Thus, the connector may be re-plugged into another socket structure, as described herein.

Returning to INQUIRY 622, if the identifier does indicate cable characteristics expected by the socket structure, then a communications handshake (also referred to as a handshake) is provided between the two connectors to ensure the connectors are plugged into the proper socket structures for communication between them, STEP 632. The handshake is controlled, in one example, by the global service processor on the rack that instructs the local service processors to have the connectors communicate with one another. In one particular example, connection elements 524 (FIG. 5A), referred to herein as topology pins, communicate with connection elements 530 (FIG. 5B), also referred to as topology pins. Similarly, connection elements or topology pins 528 (FIG. 5B) communicate with connection elements or topology pins 526 (FIG. 5A). When this back and forth communication is complete, this is indicated to the global service processor. This handshake determines if both cables are plugged into the correct socket structures for end-to-end positioning for communicating with one another.

If the handshake fails, INQUIRY 640, a determination is made as to whether this is a second pass through this part of the logic, INQUIRY 634. If it is the second pass, then the cables are indicated as bad, STEP 638. For instance, an indication is provided that a connector or cable is faulty. Otherwise, if it is not the second pass, then the cables are reset (i.e., one or more of the cables are plugged into different socket structures), STEP 636, and the process repeats starting, for instance, at STEP 602. In one embodiment, the global service processor can direct the operator of where to re-plug the connector(s). For instance, the global service processor (or in other embodiments, the local service processors) can methodically search through the system, using handshaking, to determine which socket structure is providing a signal for a connector. This position is then communicated to the operator. As a further example, if there are two cable adds in process at the same time, the topology sense or handshake tells the system (e.g., the global service processor) that the cables are swapped and can direct the operator which cables are swapped so they can be corrected. Other examples also exist. Returning to INQUIRY 640, if, however, the handshake has passed, then the bus is brought up and a test is performed, STEP 642. This completes the process.

Although in the above example, two passes are provided through the logic to allow the operator to correct errors quickly, in other embodiments, more or less than two passes may be used.

Figure 7A:
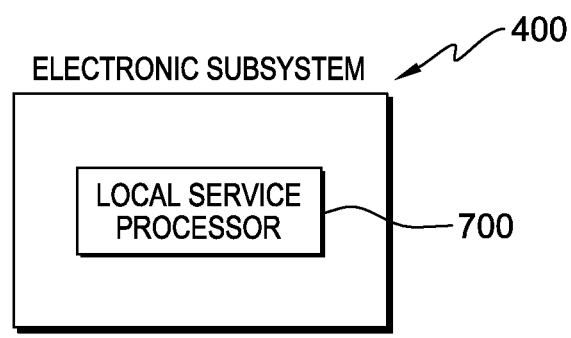
FIG. 7A depicts one example of a block diagram of a local service processor executing within an electronic subsystem.
Figure 7B:
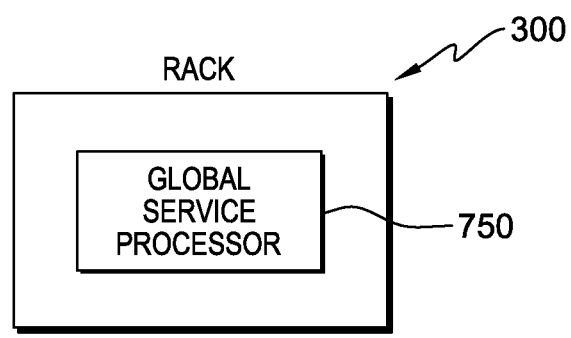
FIG. 7B depicts one example of a block diagram of a global service processor executing within a rack.

Referring to FIG. 7A, one example of a local service processor 700 executing within an electronic subsystem 400 is depicted in a block diagram. Similarly, FIG. 7B depicts a block diagram of one example of a global service processor 750 executing within a rack 300. These processors may be any type of processors, including but not limited to, System z or System p processors. Further, each processor may include or be coupled to memory and/or input/output devices.

As described herein, a capability is provided to validate connections, structural characteristics and positioning of cable connectors that enables cables, such as SMP cables, to be added to a running system or a newly configured system with confidence.

In one or more aspects, a high speed cable with defined pin-to-pin wiring is provided, as well as a cable structure using contact mating sequences to validate plugging depth; contacts to identify the cable structure; a process by which the cable structure and plugging can be identified; and/or a cable in which in the control structure the end-to-end position can be validated.

In one embodiment, a contact mating sequence on the control wafers (e.g., wafers 13 and 14) is used to mate later than the remaining contacts. This means the high speed signals have engaged to their appropriate contacts prior to the controls contacting. In this embodiment, the high speed signals are engaged about 0.5 mm before the control pins mate. After the cable is plugged with the appropriate contact sequencing, the cable is interrogated by the service processor to verify cable length, and position information with a two path process as described herein. For instance, the first connector is interrogated, then the second end is verified, and after both ends are verified by the static data included in the identifier bits, a topology or handshake protocol is used on the topology sense lines to verify the complete link is connected to the correct connector positions so the actual system process chips can start using the high speed data lanes.

This defined process provides a layer of diagnostics in which an operator can tell by where in the process it failed, why the cable/connector failed. It indicates, for instance, if it is an operator error or a failed part.

In one aspect, a capability is provided that includes, for instance, obtaining, from a connector connected to a socket structure, an identifier of a cable coupled to the connector at one end of the cable, the obtaining comprising reading information from a plurality of physical connection elements of the connector to obtain the identifier; determining, based on the identifier, whether a structural characteristic of the cable is an expected structural characteristic for that socket structure; based on determining the structural characteristic of the cable is the expected structural characteristic for that socket structure, continuing validation of connection of the connector; and based on determining the structural characteristic of the cable is not the expected structural characteristic for that socket structure, providing an indication that the connector is not as expected. The plurality of physical connection elements have a length of a first size, and the connector comprises other physical connection elements having a length of a second size, the second size differing from the first size, in one embodiment.

In one example, the structural characteristic includes a length of the cable, and further, the information includes a plurality of values read from the plurality of physical connection elements in a defined sequence to provide the identifier, the identifier identifying the length of the cable.

The continuing validation includes, for instance, obtaining, from another connector coupled to the cable at another end of the cable and connected to another socket structure, another identifier, the obtaining including reading information from another plurality of physical connection elements of the another connector to obtain the another identifier; determining, based on the another identifier, whether the structural characteristic of the cable is the expected structural characteristic for the another socket structure; and based on determining the structural characteristic of the cable is the expected structural characteristic for the another socket structure, initiating communication between the connector and the another connector.

The initiating communication includes, for instance, performing a communications handshake between the connector and the another connector using a selected plurality of connection elements of the connector and the another connector. A determination is made as to whether the communications handshake is successful. Based on determining the communications handshake is successful, initiating data communication using the cable. Based on determining the communications handshake is unsuccessful, providing an indication of such.

Further, based on determining the structural characteristic of the cable is not the expected structural characteristic, a further determination is made as to whether the identifier is a first value, wherein based on the identifier being the first value it is determined that the connector is not fully engaged in the socket structure. Yet further, based on determining the structural characteristic of the cable is not the expected structural characteristic, a further determination is made as to whether the identifier is a second value, wherein based on the identifier being the second value it is determined that the connector is not to be used.

In one embodiment, based on determining the structural characteristic of the cable is not the expected structural characteristic, a determination is made as to whether the identifier is a first value, wherein based on the identifier being the first value, it is determined that the connector is not fully engaged in the socket structure; based on the identifier not being the first value, determining whether the identifier is a second value, wherein based on the identifier being the second value, it is determined that the connector is not to be used; and based on the identifier not being the first value or the second value, it is determined that the connector is not a proper connector for the socket structure.

As will be appreciated by one of average skill in the art, aspects of embodiments may be embodied as a system, method or computer program product. Accordingly, aspects of embodiments may take the form of an entirely hardware embodiment, an entirely software embodiment (including firmware, resident software, micro-code, etc.) or an embodiment combining software and hardware aspects that may all generally be referred to herein as, for example, a "circuit," "module" or "system." Furthermore, aspects of embodiments may take the form of a computer program product embodied in one or more computer readable storage device(s) having computer readable program code embodied thereon.

One or more of the capabilities of embodiments can be implemented in software, firmware, hardware, or some combination thereof. Further, one or more of the capabilities can be emulated.

Figure 8:
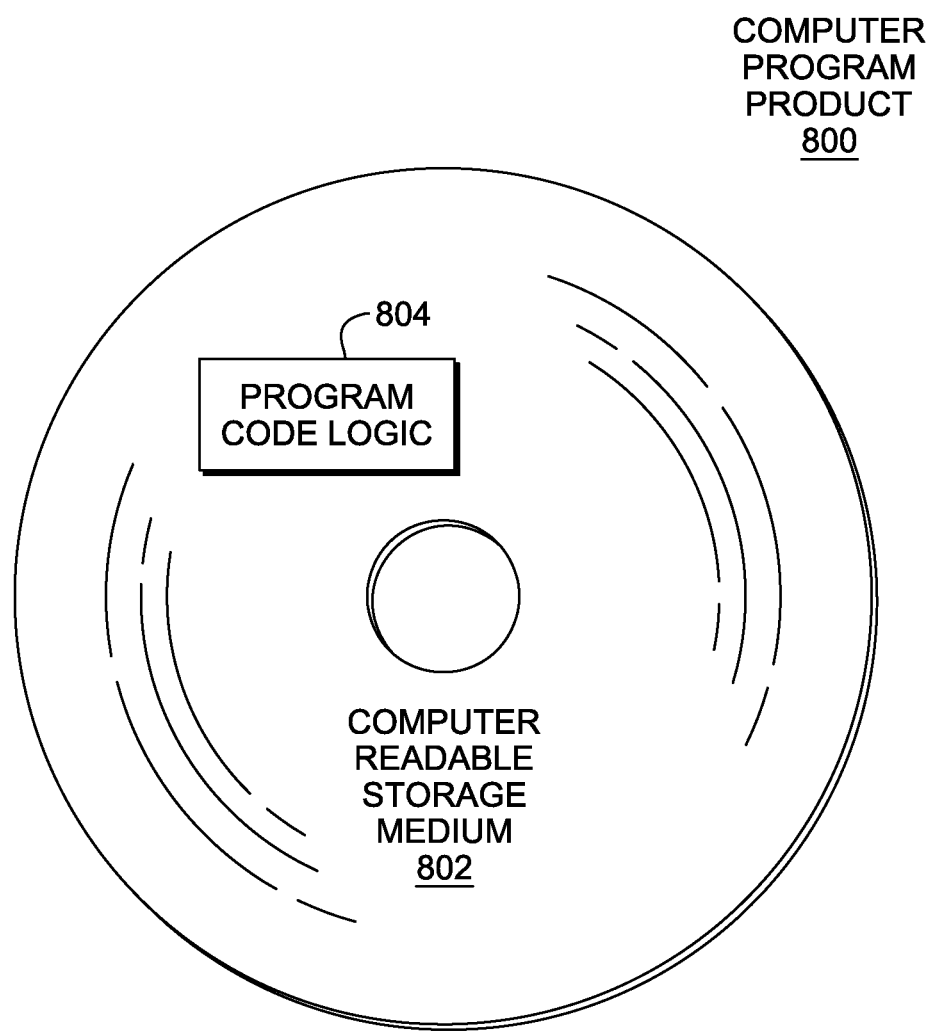
FIG. 8 depicts one embodiment of a computer program product incorporating one or more aspects.

Referring to FIG. 8, one or more aspects of embodiments can be included in an article of manufacture (e.g., one or more computer program products 800) having, for instance, computer readable storage media 802. The media has embodied therein, for instance, computer readable program code (instructions) 804 to provide and facilitate the capabilities of embodiments. The article of manufacture can be included as a part of a computer system or as a separate product.

An embodiment may be a computer program product for enabling processor circuits to perform elements of the invention, the computer program product comprising a computer readable storage medium readable by a processing circuit and storing instructions for execution by the processing circuit for performing a method.

The computer readable storage medium (or media), being a tangible, non-transitory, storage medium having instructions recorded thereon for causing a processor circuit to perform a method. The "computer readable storage medium" being non-transitory at least because once the instructions are recorded on the medium, the recorded instructions can be subsequently read one or more times by the processor circuit at times that are independent of the time of recording. The "computer readable storage media" being non-transitory including devices that retain recorded information only while powered (volatile devices) and devices that retain recorded information independently of being powered (non-volatile devices). An example, non-exhaustive list of "non-transitory storage media" includes, but is not limited to, for example: a semi-conductor storage device comprising, for example, a memory array such as a RAM or a memory circuit such as latch having instructions recorded thereon; a mechanically encoded device such as punch-cards or raised structures in a groove having instructions recorded thereon; an optically readable device such as a CD or DVD having instructions recorded thereon; and a magnetic encoded device such as a magnetic tape or a magnetic disk having instructions recorded thereon.

A non-exhaustive list of examples of computer readable storage medium include the following: a portable computer diskette, a hard disk, a random access memory (RAM), a read-only memory (ROM), an erasable programmable read-only memory (EPROM or Flash memory), a portable compact disc read-only memory (CD-ROM).

Program code can be distributed to respective computing/processing devices from an external computer or external storage device via a network, for example, the Internet, a local area network, wide area network and/or wireless network. The network may comprise copper transmission cables, optical transmission fibers, wireless transmission, routers, firewalls, switches, gateway computers and/or edge servers. A network adapter card or network interface card in each computing/processing device receives a program from the network and forwards the program for storage in a computer-readable storage device within the respective computing/processing device.

Computer program instructions for carrying out operations for aspects of embodiments may be for example assembler code, machine code, microcode or either source or object code written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described herein with reference to flowchart illustrations and/or block diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable storage medium that can direct a computer, other programmable data processing apparatus, or other devices to function in a particular.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

For instance, an application may be deployed for performing one or more aspects. As one example, the deploying of an application comprises providing computer infrastructure operable to perform one or more aspects.

As a further aspect, a computing infrastructure may be deployed comprising integrating computer readable code into a computing system, in which the code in combination with the computing system is capable of performing one or more aspects.

As yet a further aspect, a process for integrating computing infrastructure comprising integrating computer readable code into a computer system may be provided. The computer system comprises a computer readable medium, in which the computer medium comprises one or more aspects. The code in combination with the computer system is capable of performing one or more aspects.

Although various embodiments are described above, these are only examples. For example, computing environments of other architectures can incorporate and use one or more aspects. Further, a system may have more or less connectors and/or socket structures than described in the example provided herein. Further, connectors of other configurations may be used. Additionally, the sequencing may be in another order, and/or other structural characteristics may be checked. Many other variations are possible.

Further, other types of computing environments can benefit from one or more aspects. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the aspects for various embodiments with various modifications as are suited to the particular use contemplated.

What is claimed is:

1. A method of validating connections of connectors, said method comprising:
    obtaining, from a connector connected to a socket structure, an identifier of a cable coupled to the connector at one end of the cable, the obtaining comprising reading information from a plurality of physical connection elements of the connector to obtain the identifier, wherein the identifier serves as an indication of whether the cable is properly physically engaged in the socket structure;
    determining, based on the identifier, whether a structural characteristic of the cable is an expected structural characteristic for that socket structure;
    based on determining the structural characteristic of the cable is the expected structural characteristic for that socket structure, continuing validation of connection of the connector; and
    based on determining the structural characteristic of the cable is not the expected structural characteristic for that socket structure, providing an indication that the connector is not as expected.

2. The method of claim 1, wherein the structural characteristic comprises a length of the cable.

3. The method of claim 2, wherein the information comprises a plurality of values read from the plurality of physical connection elements in a defined sequence to provide the identifier, the identifier identifying the length of the cable.

4. The method of claim 1, wherein the continuing validation comprises:
    obtaining, from another connector coupled to the cable at another end of the cable and connected to another socket structure, another identifier, the obtaining comprising reading information from another plurality of physical connection elements of the another connector to obtain the another identifier;
    determining, based on the another identifier, whether the structural characteristic of the cable is the expected structural characteristic for the another socket structure; and
    based on determining the structural characteristic of the cable is the expected structural characteristic for the another socket structure, initiating communication between the connector and the another connector.

5. The method of claim 4, wherein the initiating communication comprises performing a communications handshake between the connector and the another connector using a selected plurality of connection elements of the connector and the another connector.

6. The method of claim 5, further comprising:
    determining whether the communications handshake is successful;
    based on determining the communications handshake is successful, initiating data communication using the cable; and
    based on determining the communications handshake is unsuccessful, providing an indication of such.

7. The method of claim 1, wherein based on determining the structural characteristic of the cable is not the expected structural characteristic, a further determination is made as to whether the identifier is a first value, wherein based on the identifier being the first value it is determined that the connector is not fully engaged in the socket structure.

8. The method of claim 1, wherein based on determining the structural characteristic of the cable is not the expected structural characteristic, a further determination is made as to whether the identifier is a second value, wherein based on the identifier being the second value it is determined that the connector is not to be used.

9. The method of claim 1, wherein based on determining the structural characteristic of the cable is not the expected structural characteristic:
    determining whether the identifier is a first value, wherein based on the identifier being the first value, it is determined that the connector is not fully engaged in the socket structure;
    based on the identifier not being the first value, determining whether the identifier is a second value, wherein based on the identifier being the second value, it is determined that the connector is not to be used; and
    based on the identifier not being the first value or the second value, it is determined that the connector is not a proper connector for the socket structure.

10. The method of claim 1, wherein the plurality of physical connection elements have a length of a first size, and wherein the connector comprises other physical connection elements having a length of a second size, the second size differing from the first size.

11. The method of claim 1, wherein the information is built into the physical connection elements of the connector.

* * * * *